(12) United States Patent
Driscoll et al.

(10) Patent No.: US 7,170,757 B2
(45) Date of Patent: Jan. 30, 2007

(54) FIELD CHANGEABLE GRAPHICS SYSTEM FOR A COMPUTING DEVICE

(75) Inventors: Daniel J. Driscoll, Spring, TX (US); Joseph D. Walters, San Jose, CA (US); Craig E. Dowdall, Santa Clara, CA (US); Charles E. Buffington, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 279 days.

(21) Appl. No.: 10/822,014

(22) Filed: Apr. 9, 2004

(65) Prior Publication Data

US 2005/0225954 A1    Oct. 13, 2005

(51) Int. Cl.
*H05K 1/14* (2006.01)
*H05K 7/10* (2006.01)

(52) U.S. Cl. .................. 361/785; 361/742; 361/790; 361/804

(58) Field of Classification Search ............. None
See application file for complete search history.

(56) References Cited

U.S. PATENT DOCUMENTS

| | | | |
|---|---|---|---|
| 4,200,900 A | | 4/1980 | McGeorge |
| 4,602,316 A * | | 7/1986 | Feick ................... 361/803 |
| 4,969,066 A * | | 11/1990 | Eibl et al. .............. 361/785 |
| 5,575,686 A * | | 11/1996 | Noschese ............... 439/620 |
| 5,783,870 A * | | 7/1998 | Mostafazadeh et al. ..... 257/791 |
| 6,222,739 B1 * | | 4/2001 | Bhakta et al. .......... 361/790 |
| 6,313,984 B1 * | | 11/2001 | Furay ................... 361/685 |
| 6,331,939 B1 * | | 12/2001 | Corisis et al. .......... 361/784 |
| 6,671,177 B1 | | 12/2003 | Han |
| 6,731,514 B2 * | | 5/2004 | Evans .................... 361/790 |
| 6,731,515 B2 * | | 5/2004 | Rhoads ................... 361/796 |
| 6,924,437 B1 * | | 8/2005 | Creekmore et al. ..... 174/138 G |
| 7,005,586 B1 * | | 2/2006 | Duley .................... 174/261 |
| 7,045,890 B2 * | | 5/2006 | Xie et al. ............... 257/706 |
| 7,061,087 B2 * | | 6/2006 | Kim ..................... 257/686 |
| 7,102,892 B2 * | | 9/2006 | Kledzik et al. .......... 361/770 |
| 2004/0012082 A1 * | | 1/2004 | Dewey et al. ........... 257/686 |

* cited by examiner

*Primary Examiner*—John B. Vigushin
(74) *Attorney, Agent, or Firm*—Patterson & Sheridan L.L.P.

(57) ABSTRACT

One embodiment of a field changeable graphics system for a computing device includes a graphics card and an interface assembly. The interface assembly is adapted to interface the graphics card with the motherboard of a computing device, without directly mounting the graphics card to the motherboard. One advantage of the disclosed graphics system is that it enables a computing device user to upgrade the existing device's graphics system. Thus, the user is not forced to purchase an entirely new computing device in order to take advantage of graphics innovations. This advantage is particularly significant for users of portable computing devices, such as laptop computers and PDAs.

29 Claims, 7 Drawing Sheets

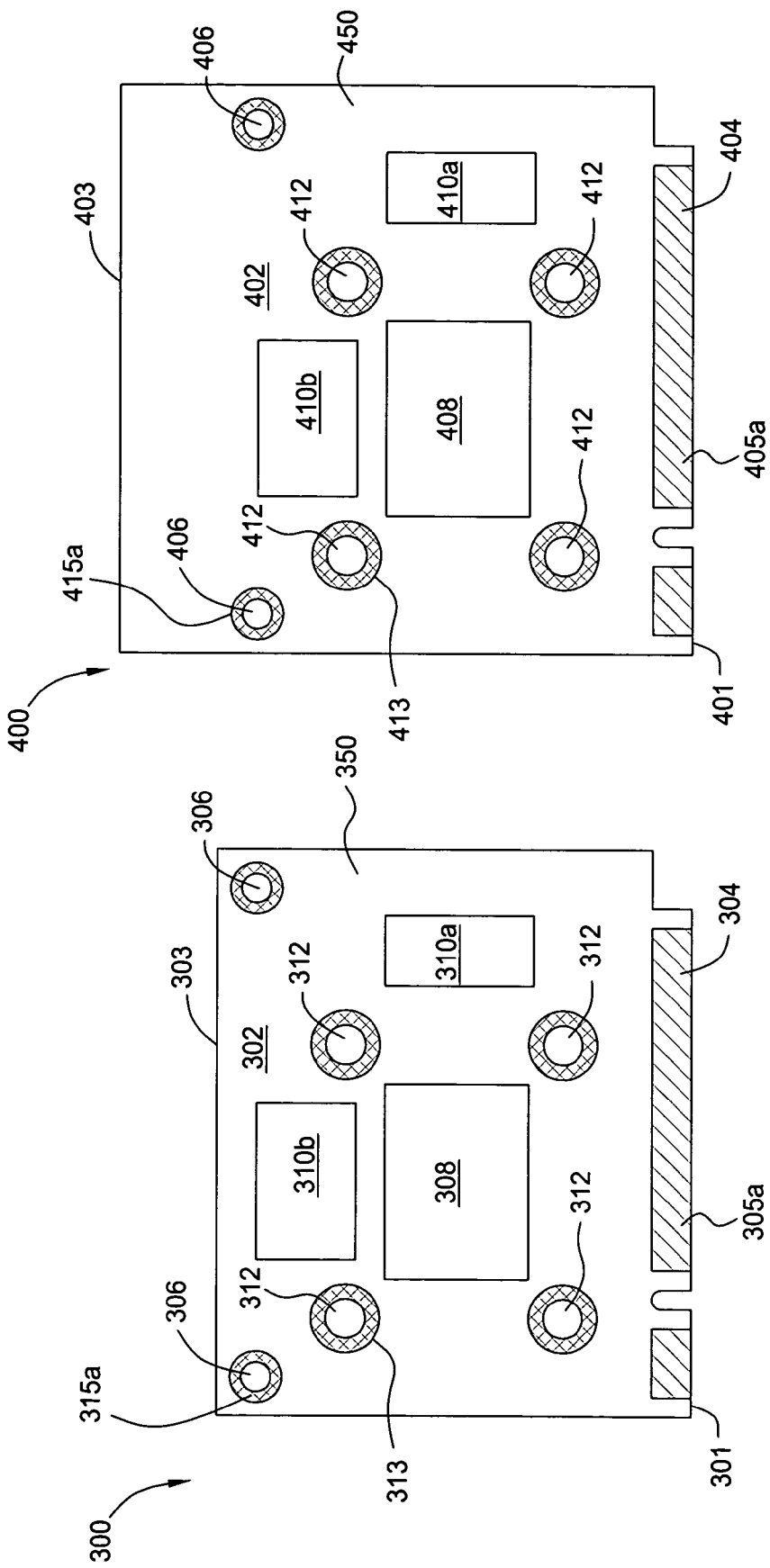

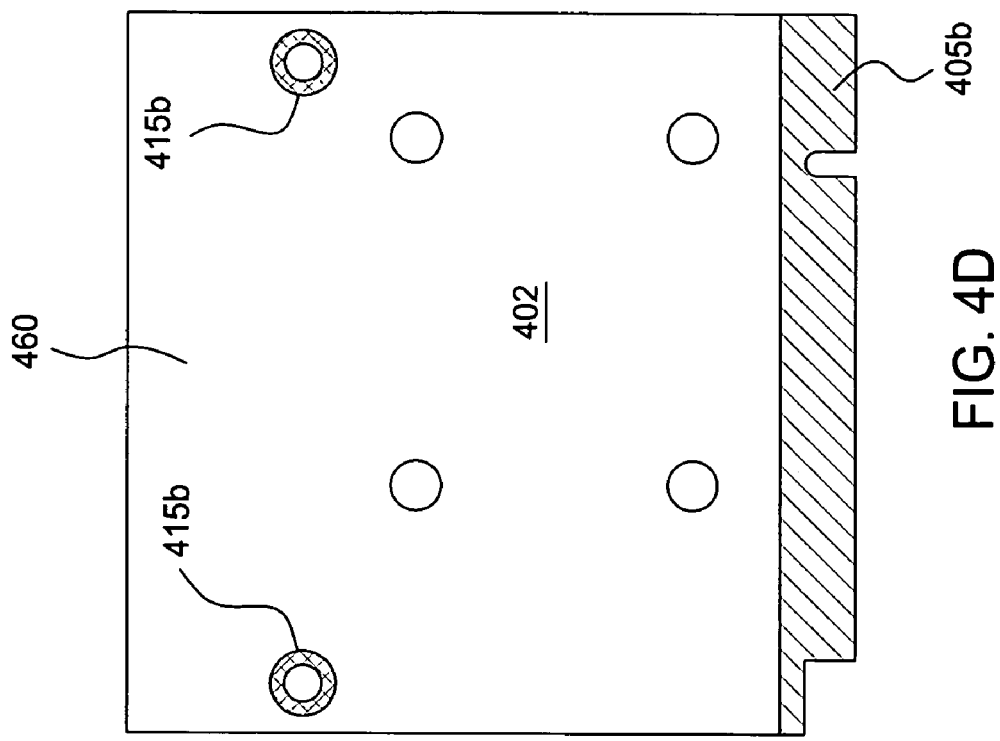
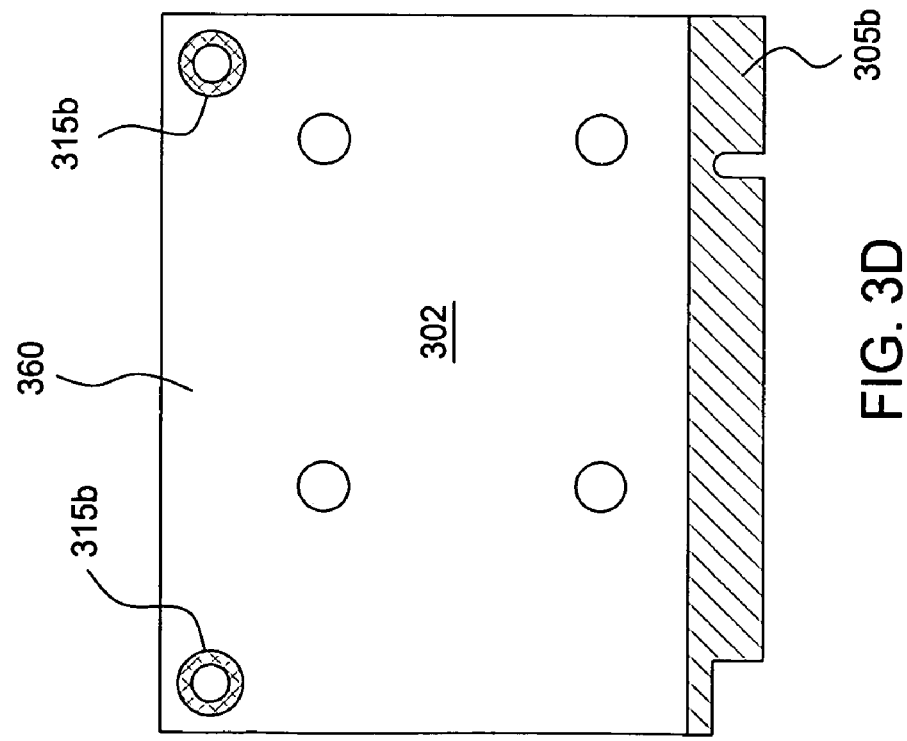

FIELD CHANGEABLE GRAPHICS SYSTEM FOR A COMPUTING DEVICE

BACKGROUND OF THE INVENTION

1. Field of the Invention

This invention relates generally to computer hardware and relates more particularly to a field changeable graphics system for a computing device.

2. Description of the Background Art

Contemporary computing devices typically incorporate a graphics card that enables a computing device to rapidly process graphics related data for graphics intensive applications, such as gaming applications. A graphics card generally comprises a printed circuit board (PCB) upon which a plurality of circuit components (such as memory chips and the like) and a graphics processing unit (GPU) are mounted. In "closed platform" computing devices such as laptop computers, cellular telephones and personal digital assistants (PDAs) (i.e., devices that use processors and are not easily changed by a user), the graphics card is mounted directly and permanently to the motherboard of the computing device.

One drawback to mounting the graphics card directly to the motherboard is that this fixed configuration impedes a user's ability to upgrade the computing device's graphics system. Specifically, in order to take advantage of an improved graphics system, the user typically must purchase an entirely new computing device, which is much more costly than a simple replacement of the graphics system in the existing computing device.

A second drawback is that the pace of graphics innovations that can be conveniently delivered to computing device users is hindered, because the implementation of on-board devices is typically limited by a design cycle of approximately nine to twelve months.

Thus, there is a need in the art for a field changeable graphics system for a computing device.

SUMMARY OF THE INVENTION

One embodiment of a field changeable graphics system for a computing device includes a graphics card and an interface assembly. The interface assembly is adapted to interface the graphics card with the motherboard of a computing device, without directly mounting the graphics card to the motherboard.

One advantage of the disclosed graphics system is that it enables a computing device user to upgrade the existing device's graphics system. Thus, the user is not forced to purchase an entirely new computing device in order to take advantage of graphics innovations. This advantage is particularly significant for users of portable computing devices, such as laptop computers, cellular telephones and PDAs or other devices traditionally having fixed graphics functionality such as video game consoles.

BRIEF DESCRIPTION OF THE DRAWINGS

FIG. 3A is a top plan view illustrating a graphics card for use in the field changeable graphics system illustrated in FIG. 1, according to another embodiment of the present invention;

FIG. 3D is a bottom plan view illustrating surface keep outs on the second face of the graphics card illustrated in FIG. 3A, according to one embodiment of the present invention;

FIG. 4A is a top plan view illustrating a graphics card for use in the field changeable graphics system illustrated in FIG. 1, according to another embodiment of the present invention;

FIG. 4D is a bottom plan view illustrating surface keep outs on the second face of the graphics card illustrated in FIG. 4A, according to one embodiment of the present invention.

DETAILED DESCRIPTION OF THE INVENTION

Figure 1:
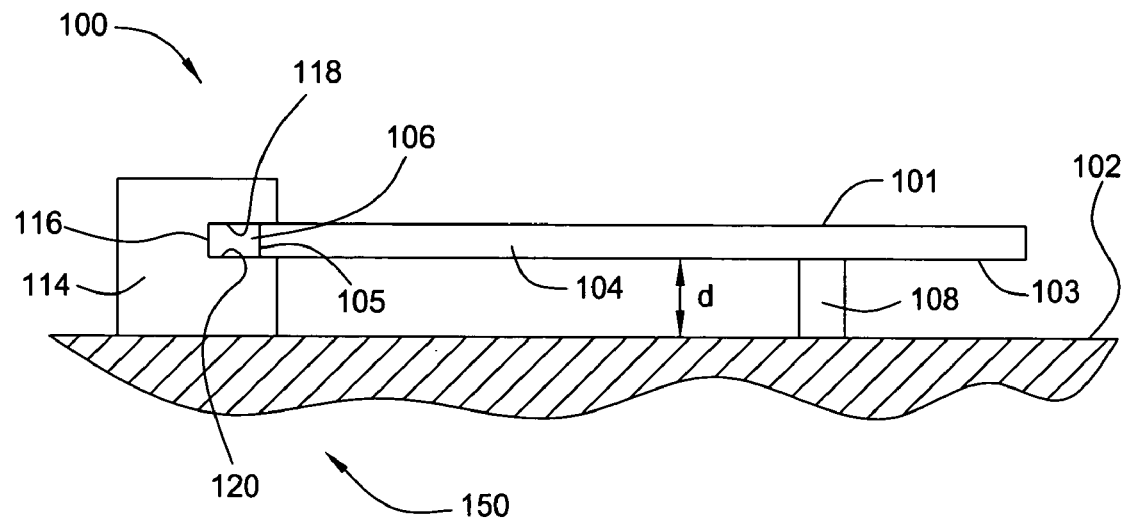
FIG. 1 is a side view illustrating a field changeable graphics system, according to one embodiment of the present invention.

FIG. 1 is a side view illustrating a field changeable graphics system 100, according to one embodiment of the present invention. Graphics system 100 is adaptable for use with any type of computing device, including, without limitation, a desktop computer, server, laptop computer, palm-sized computer, personal digital assistant, tablet computer, game console, cellular telephone, computer-based simulator and the like. As will be explained in further detail below in conjunction with FIGS. 2A–4D, graphics system 100 is configured to ensure compatibility with a plurality of field changeable graphics cards.

Generally, graphics system 100 is configured to interface with a computing device motherboard 102 in lieu of a conventional graphics card and includes, without limitation, a graphics card 104 and an interface assembly 150. Graphics card 104 includes a GPU and a plurality of circuit components including memory (not shown) mounted to a first face 101, typically facing away from motherboard 102. Graphics card 104 further comprises a card connector 106 positioned along an edge 105 of graphics card 104 and adapted to engage interface assembly 150.

As also described in further detail below in conjunction with FIGS. 2A–4D, graphics card 104 is configured to interface with motherboard 102 without being directly mounted to motherboard 102. This is enabled by interface assembly 150, which includes, without limitation, one or more supports 108 and an edge connector 114. Supports 108 are mounted to motherboard 102 and extend upward therefrom to engage graphics card 104. Supports 108 are adapted to stably maintain graphics card 104 in a substantially parallel, spaced-apart orientation relative to motherboard 102. In one embodiment, supports 108 are sized to maintain a distance d between graphics card 104 and motherboard 102 that is approximately 4 mm.

Edge connector 114 is described in further detail in co-pending U.S. Pat. application Ser. No. 10/822,013, filed simultaneously herewith (Attorney Docket No. NVDA/P001199). Edge connector 114 is mounted to motherboard 102 and includes a lengthwise channel 116 having a plurality of contacts disposed on upper and lower surfaces 118, 120. The contacts are adapted for engaging card connector 106 and for routing external and internal interfaces from graphics card 104 to motherboard 102. In one embodiment, edge connector 114 is a 230-pin right angle edge connector that interfaces with card connector 106.

Figure 2A:
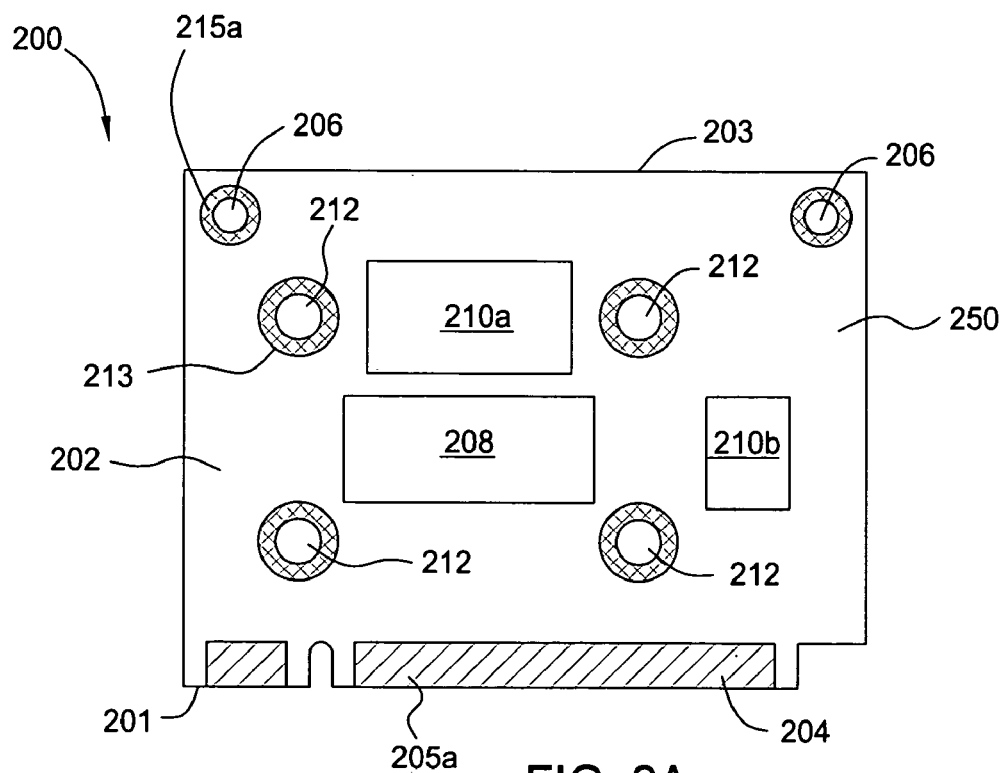
FIG. 2A is a top plan view illustrating a graphics card for use in the field changeable graphics system illustrated in FIG. 1, according to one embodiment of the present invention.

FIG. 2A is a top plan view illustrating a graphics card 200 for use in field changeable graphics system 100 of FIG. 1, according to one embodiment of the present invention. Similar to graphics card 104 of FIG. 1, graphics card 200 may be adapted for use in any type of appropriate computing device. In the embodiment illustrated, graphics card 200 includes, without limitation, a PCB 202, a card connector zone 204, a GPU zone 208 and a plurality of memory zones 210A–B (hereinafter collectively referred to as "memory zones 210").

Card connector zone 204 is positioned along a first edge 201 of PCB 202 and is sized to accommodate a plurality of plated contacts for interfacing graphics card 200 to a motherboard-mounted edge connector, such as edge connector 114 of FIG. 1. One embodiment of a suitable card connector is described in U.S. patent application Ser. No. 10/822,013, (NVDA P001199).

GPU zone 208 and memory zones 210 are positioned on a first face 250 of PCB 202 (e.g., an upward-facing face, such as face 101 of graphics card 104 in FIG. 1). GPU zone 208 is positioned proximate to the center of PCB 202 and is sized to receive any GPU of up to 35 mm×35 mm in size. A first memory zone 210A is positioned between GPU zone 208 and a second edge 203 of PCB 202 (e.g., opposite first edge 203). A second memory zone 210B is positioned laterally from GPU zone 208, e.g., proximate to an edge that is substantially perpendicular to edge 201. Memory zones 210A and 210B are each sized to receive up to two pieces of memory. In one embodiment, if the full available space (e.g., defined by GPU zone 208 and memory zones 210) is utilized by on-board components, graphics card 200 consumes a maximum power of up to 18 W in operation.

PCB 202 additionally comprises at least two support holes 206 adapted for engaging graphics system supports on a motherboard (such as supports 108 in FIG. 1). Support holes 206 are formed near second edge 203 of PCB 202, opposite card connector zone 204. As described further in conjunction with FIG. 5, one embodiment of graphics card 200 further includes a plurality of mounting holes 212 adapted for interfacing graphics card 200 to a cooling system (not shown).

A plurality of mechanical "keep out" zones is defined on PCB 202 in order to ensure compatibility with a standardized graphics system configuration, such as graphics system 100 of FIG. 1. Keep out zones are a combination of z-height restricted zones and surface keep outs on PCB 202 that are designed to accommodate a cooling system.

Surface keep outs for first face 250 of PCB 202 are illustrated in FIG. 2A. A first set of surface keep outs 213 is defined surrounding mounting holes 212. Surface keep outs 213 are generally concentric with mounting holes 212 and are sized to accommodate varied cooling system designs and grounding of the cooling system to reduce electromagnetic interference (EMI). A second set of surface keep outs 215a is defined surrounding support holes 206. Surface keep outs 215a are generally concentric with support holes 206 and are sized to accommodate mechanical integration of graphics card 200 to a motherboard, e.g., via supports 108 of FIG. 1. A third surface keep out, 205a is defined in the region of card connector zone 204 to accommodate appropriate card connector design and integration.

Figure 2C:
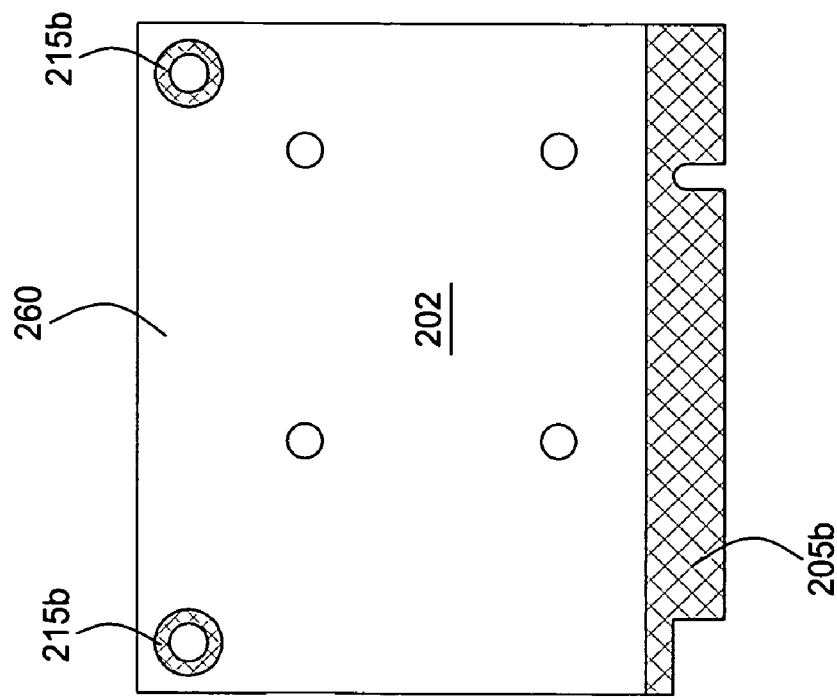
FIG. 2C is a bottom plan view illustrating surface keep outs on a second face of the graphics card illustrated in FIG. 2A, according to one embodiment of the present invention.

FIG. 2C is a bottom plan view illustrating surface keep outs on second face 260 of PCB 202, according to one embodiment of the present invention. In one embodiment, a first set of surface keep outs 215b is defined surrounding support holes 206, and a second surface keep out 205b is defined in the region of card connector 204.

Figure 2B:
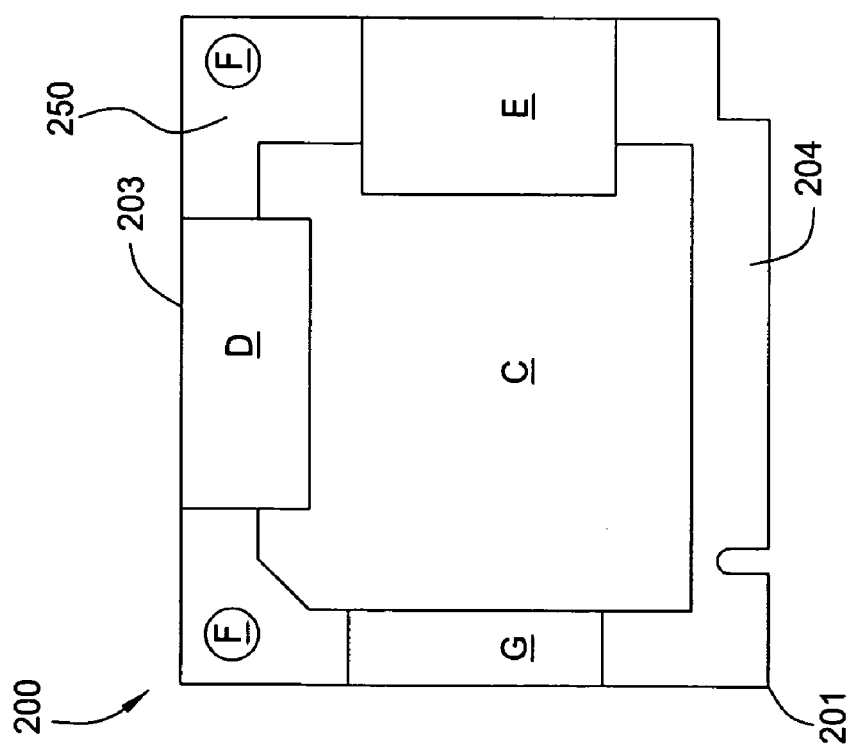
FIG. 2B is a top plan view illustrating z-height restricted zones for a first face of the graphics card illustrated in FIG. 2A, according to one embodiment of the present invention.

FIG. 2B is a top plan view illustrating z-height restricted zones for first face 250 of PCB 202, according to one embodiment of the present invention. A general z-height restricted zone (not shown) covers substantially the entire first face 250 of PCB 202 and defines the maximum height that any surface mounted component (e.g., a GPU, memory, or other circuit component) may extend above PCB 202. In one embodiment, the maximum height defined by the general z-height restricted zone is approximately 3.5 mm. As described in further detail below, first face 250 of PCB 202 also includes a plurality of specific, localized z-height restricted zones. To the extent that any z-height restricted zones overlap in a given region, the criteria of the more restrictive zone are controlling.

As described in further detail below in conjunction with FIG. 5, a first specific z-height zone, zone C, defines the maximum height between PCB 202 and a mounting plate (not shown) for mounting a cooling system to graphics card 200. In one embodiment, the maximum height defined by zone C is 1.84 mm. A second specific z-height zone, zone D, is defined between PCB 202 and a memory spreader plate (not shown) associated with memory zone 210A of FIG. 2A. A third specific z-height zone, zone E, is defined between PCB 202 and a memory spreader plate (not shown) associated with memory zone 210B. Zones D and E are each configured to accommodate power supply components for two pieces of memory. In one embodiment, the maximum height defined by zone D is 2.00 mm, while the maximum height defined by zone E is 0.66 mm. In one embodiment, all three zones C–E may be associated with a single, integrally formed cooling system mounting plate, in which case the maximum height defined under all three zones C–E is 0.66 mm.

A fourth specific z-height zone, Zone F, comprises two separate, cylindrically shaped zero-height regions associated with support holes 206. Zone F is configured to accommodate an attachment feature and/or fastener for coupling graphics card 200 to supports on a motherboard, such as supports 108 of FIG. 1. "Zero-height" indicates that no other on-board components (e.g., memory chips and the like) may be placed in Zone F. In one embodiment, a global maximum height over the board defined by zone F is 3.5 mm.

In one embodiment, first face 250 of PCB 202 further includes a fifth specific z-height zone, zone G, positioned along a side of zone C opposite zone E, and configured to accommodate a portion of a cooling system for transferring heat from a GPU (or a mounting plate) to a remote heat exchanger (not shown). Zone G defines a maximum height restriction in locations where portions of the cooling system may extend from PCB 202. In one embodiment, the maximum height defined by zone G is 2.64 mm.

FIG. 3A is a top plan view illustrating a graphics card 300 for use in the field changeable graphics system 100 illustrated in FIG. 1, according to another embodiment of the present invention. Similar to graphics card 200 of FIG. 2, graphics card 300 includes, without limitation, a PCB 302, a card connector zone 304, a GPU zone 308 and a plurality of memory zones 310A–B (hereinafter collectively referred to as "memory zones 310").

Card connector zone 304 is positioned along a first edge 301 of PCB 302. Card connector zone 304 is substantially identical to card connector zone 204 of FIG. 2 and is sized to accommodate a plurality of plated contacts for interfacing graphics card 300 to a motherboard-mounted edge connector.

GPU zone 308 and memory zones 310 are positioned on a first face 350 of PCB 302 (e.g., an upward-facing face, such as face 101 of graphics card 104 in FIG. 1). GPU zone 308 is positioned proximate to the center of PCB 302 and is sized to receive any GPU of up to 35 mm×35 mm in size. A first memory zone 310A is positioned laterally from GPU zone 308, e.g., proximate to an edge that is substantially perpendicular to edge 301. A second memory zone 310B is positioned adjacent to GPU zone 308, opposite card connector zone 304. Collectively, memory zones 310A and 310B are sized to receive up to four pieces of memory. Additional memory zones located on a second face of PCB 302 (not shown) are sized to collectively receive an additional four pieces of memory. Thus, graphics card 300 is configured to support substantially the same graphics processing power as graphics card 200, but additionally supports up to two times as much memory. In one embodiment, if the full available space (e.g., defined by GPU zone 308 and memory zones 310) is utilized by on-board components, graphics card 300 consumes a maximum power of up to 25 W in operation.

PCB 302 additionally comprises at least two support holes 306 adapted for engaging graphics system supports on a motherboard (such as supports 108 in FIG. 1). Support holes 306 are formed near a second edge 303 of PCB 302 that is opposite card connector zone 304. As described further in conjunction with FIG. 5, one embodiment of graphics card 300 further includes a plurality of mounting holes 312 adapted for interfacing graphics card 300 to a cooling system (not shown).

As with graphics card 200 of FIG. 2, a plurality of mechanical "keep out" zones is defined on graphics card 300 in order to ensure compatibility with a standardized graphics system configuration, such as graphics system 100 of FIG. 1. Surface keep outs for first face 350 of PCB 302 are illustrated in FIG. 3A. A first set of surface keep outs 313 is defined surrounding mounting holes 312. Surface keep outs 313 are generally concentric with mounting holes 312 and are sized to accommodate varied cooling system designs and grounding of the cooling system to reduce EMI. A second set of surface keep outs 315a is defined surrounding support holes 306. Surface keep outs 315a are generally concentric with support holes 306 and are sized to accommodate mechanical integration of graphics card 300 to a motherboard, e.g., via supports 108 of FIG. 1. A third surface keep out 305a is defined in the region of card connector zone 304 to accommodate appropriate card connector design and integration.

FIG. 3D is a bottom plan view illustrating surface keep outs on second face 360 of PCB 302, according to one embodiment of the present invention. In one embodiment, a first set of surface keep outs 315b is defined surrounding support holes 306, and a second surface keep out 305b is defined in the region of card connector 304.

Figure 3C:
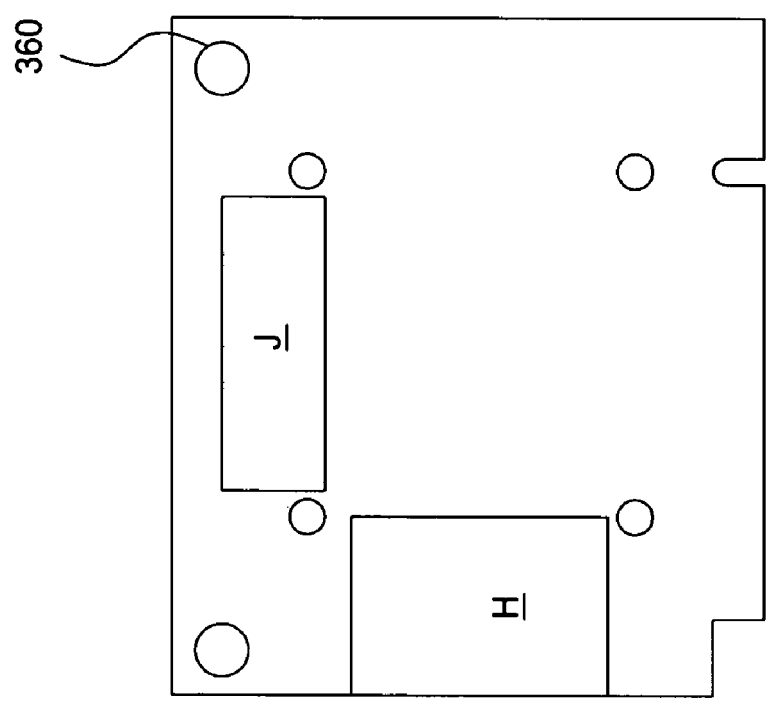
FIG. 3C is a bottom plan view illustrating z-height restricted zones for a second face of the graphics card illustrated in FIG. 3A, according to one embodiment of the present invention.
Figure 3B:
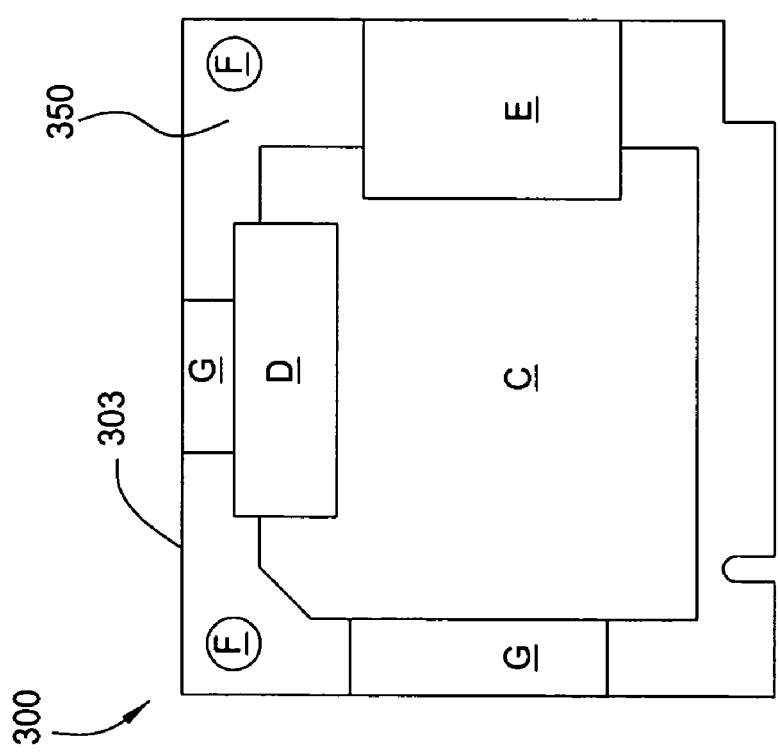
FIG. 3B is a top plan view illustrating z-height restricted zones for a first face of the graphics card illustrated in FIG. 3A, according to one embodiment of the present invention.

FIG. 3B is a top plan view illustrating z-height restricted zones for first face 350 of PCB 302, according to one embodiment of the present invention. A general z-height restricted zone (not shown) covers substantially the entire first face 350 of PCB 302 and defines the maximum height that any surface mounted component (e.g., a GPU, memory, or other circuit component) may extend above PCB 302. In one embodiment, the maximum height defined by the general z-height restricted zone is approximately 3.5 mm.

Specific z-height zones C–F are substantially equivalent to specific zones C–F defined with respect to FIG. 2B. Zone G is also substantially equivalent to zone G defined in FIG. 2B, but comprises two distinct sections. A first section of zone G is positioned along a side of zone C opposite zone E, and a second section of zone G is positioned between zone D and second edge 303 of PCB 302. Both sections of zone G define a maximum height restriction in locations where portions of a cooling system may extend from PCB 302. In one embodiment, the maximum height defined by zone G is 2.64 mm.

FIG. 3C is a bottom plan view illustrating z-height restricted zones for the second face 360 of graphics card 300, according to one embodiment of the present invention. A general z-height restricted zone (not shown) is substantially equivalent to the general z-height restricted zone described with reference to graphics card 200. A first specific z-height restricted zone, zone H, is positioned opposite card connector 304 and defines the maximum height between PCB 302 and a mounting plate (not shown) for coupling a cooling system to a first memory zone on second face 360. A second specific z-height restricted zone, zone J, is positioned laterally from GPU 308 and defines the maximum height between PCB 302 and a mounting plate (not shown) for mounting a cooling system to a second memory zone on second face 360. In one embodiment, the maximum heights defined by zones H and J are both 0.66 mm.

FIG. 4A is a top plan view illustrating a graphics card 400 for use in the field changeable graphics system illustrated in FIG. 1, according to another embodiment of the present invention. Similar to graphics cards 200 and 300 of the preceding figures, graphics card 400 includes, without limitation, a PCB 402, a card connector zone 404, a GPU zone 408 and a plurality of memory zones 410A–B (hereinafter collectively referred to as "memory zones 410").

Card connector zone 404 is positioned along a first edge 401 of PCB 402. Card connector 404 is substantially identical to card connectors 204 and 304 of the preceding figures and is sized to accommodate a plurality of plated contacts for interfacing graphics card 300 to a motherboard-mounted edge connector.

GPU zone 408 and memory zones 410 are positioned on a first face 450 of PCB 402 (e.g., an upward-facing face, such as face 101 of graphics card 104 in FIG. 1). GPU zone 408 is positioned proximate to the center of PCB 402 and is sized to receive any GPU of up to 40 mm×40 mm in size. A first memory zone 410A is positioned laterally from GPU zone 408, e.g., proximate to an edge that is substantially perpendicular to edge 401. A second memory zone 410B is positioned adjacent to GPU zone 408, opposite card connector 404. Collectively, memory zones 410A and 410B are sized to receive up to four pieces of memory. Additional memory zones located on a second face of graphics card 400 (not shown) are sized to collectively receive an additional four pieces of memory. Thus, graphics card 400 is configured to support substantially the same amount of memory as graphics card 300, but additionally supports substantially more graphics processing power than graphics cards 200 and 300. In one embodiment, if the full available space (e.g., defined by GPU zone 408 and memory zones 410) is utilized by on-board components, graphics card 400 consumes a maximum power of up to 35 W in operation.

PCB 402 additionally comprises at least two support holes 406 adapted for engaging graphics system supports on a motherboard (such as supports 108 in FIG. 1). Support holes 406 are formed near a second edge 403 of PCB 402 that is opposite card connector zone 404. As described further in conjunction with FIG. 5, one embodiment of graphics card 400 further includes a plurality of mounting holes 412 adapted for interfacing graphics card 400 to a cooling system (not shown).

As with graphics cards 200 and 300 of the preceding figures, a plurality of mechanical "keep out" zones is defined on graphics card 400 in order to ensure compatibility with a standardized graphics system configuration, such as graphics system 100 of FIG. 1. Surface keep outs for first face 450 of PCB 402 are illustrated in FIG. 4A. A first set of surface keep outs 413 is defined surrounding mounting holes 412. Surface keep outs 413 are generally concentric with mounting holes 412 and are sized to accommodate varied cooling system designs and grounding of the cooling system to reduce EMI. A second set of surface keep outs 415a is defined surrounding support holes 406. Surface keep outs 415a are generally concentric with support holes 406 and are sized to accommodate mechanical integration of graphics card 400 to a motherboard, e.g., via supports 108 of FIG. 1. A third surface keep out 405a is defined in the region of card connector zone 404 to accommodate appropriate card connector design and integration.

FIG. 4D is a bottom plan view illustrating surface keep outs on second face 460 of PCB 402, according to one embodiment of the present invention. In one embodiment, a first set of surface keep outs 415b is defined surrounding support holes 406, and a second surface keep out 405b is defined in the region of card connector 404.

Figure 4C:
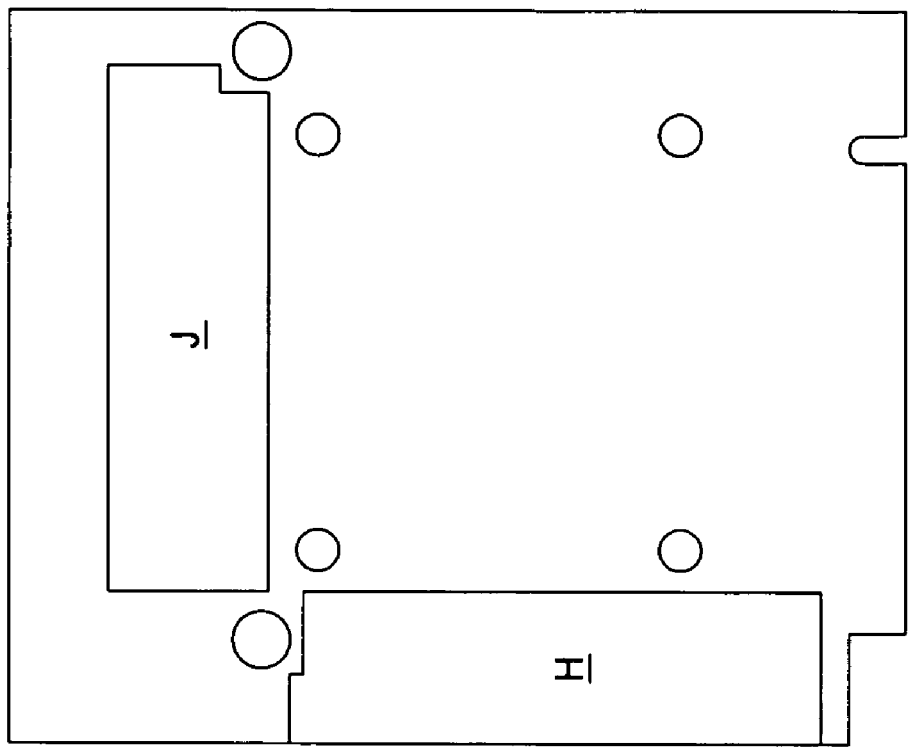
FIG. 4C is a bottom plan view illustrating z-height restricted zones for a second face of the graphics card illustrated in FIG. 4A, according to one embodiment of the present invention.
Figure 4B:
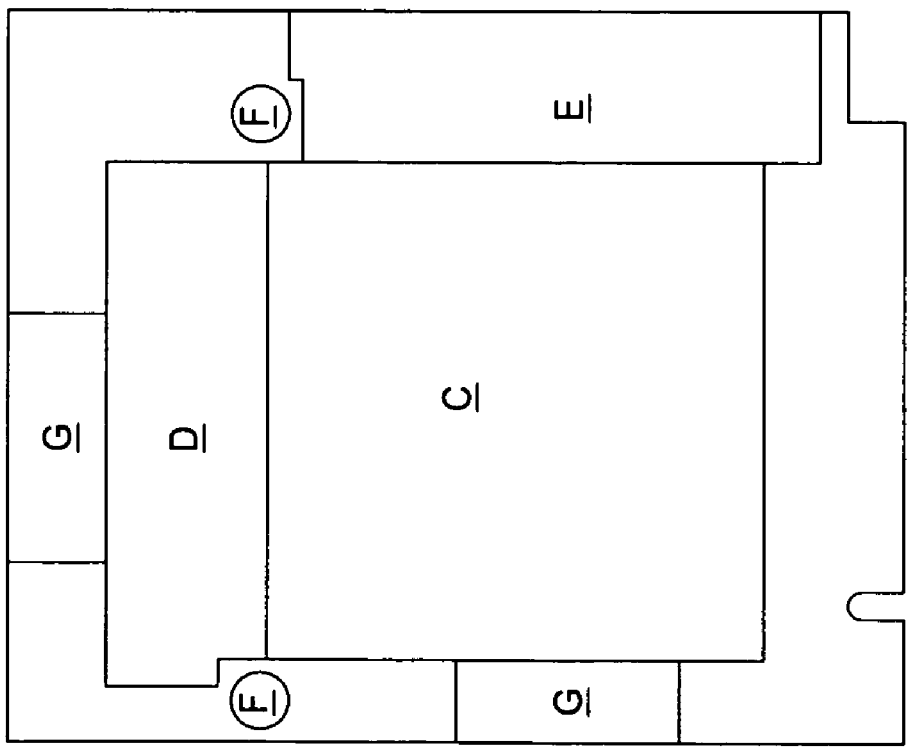
FIG. 4B is a top plan view illustrating z-height restricted zones for a first face of the graphics card illustrated in FIG. 4A, according to one embodiment of the present invention.

FIG. 4B is a top plan view illustrating z-height restricted zones for first face 450 of PCB 402, according to one embodiment of the present invention. A general z-height restricted zone (not shown) covers substantially the entire first face 450 of PCB 402 and defines the maximum height that any surface mounted component (e.g., a GPU, memory, or other circuit component) may extend above PCB 402. In one embodiment, the maximum height defined by the general z-height restricted zone is approximately 3.5 mm.

Specific z-height zones C–F are substantially equivalent to specific zones C–F defined with respect to FIGS. 2B and 3B. However, in one embodiment, zone D on first face 450 of PCB 402 defines a maximum height of 0.66 mm. Zone G is also substantially equivalent to zone G defined in FIG. 3B.

FIG. 4C is a bottom plan view illustrating z-height restricted zones for the second face 460 of graphics card 400, according to one embodiment of the present invention. A general z-height restricted zone (not shown) is substantially equivalent to the general z-height restricted zone described with reference to graphics cards 200 and 300. Specific z-height restricted zones H and J are also substantially equivalent to zones H and J defined in FIG. 3B.

Figure 5:
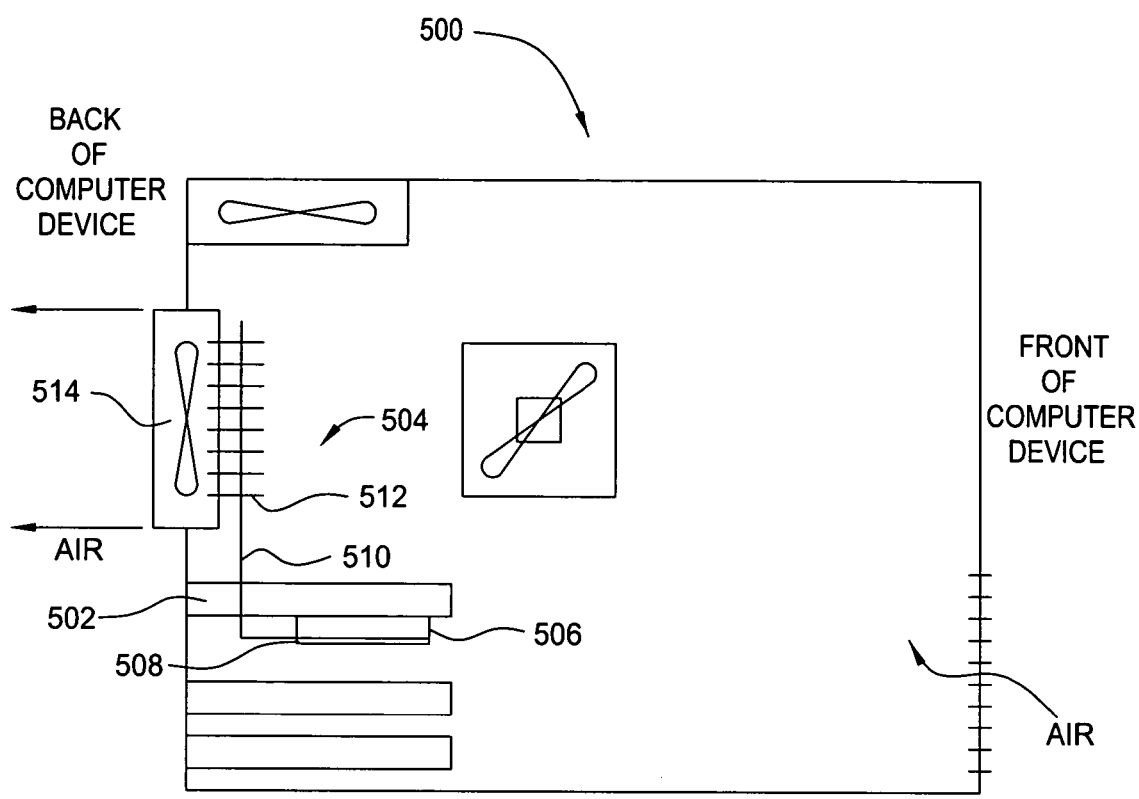
FIG. 5 is a schematic diagram illustrating a computing device, within which a field changeable graphics card and an associated cooling system are incorporated, according to one embodiment of the present invention.

FIG. 5 is a schematic diagram illustrating a computing device 500, within which a field changeable graphics card 502 and an associated cooling system 504 are incorporated, according to one embodiment of the present invention. Graphics card 502 may be any of the graphics cards 200, 300 or 400 described with reference to the preceding figures. Cooling system 504 is coupled to graphics card 502 in order to dissipate heat generated by a GPU 506 and other surface mounted components (not shown). In one embodiment, cooling system 504 is interfaced to graphics card 502 via a mounting plate 508 that is adapted for coupling to mounting holes (e.g., mounting holes 212, 312 or 412 of the preceding figures) on graphics card 502.

One embodiment of a suitable cooling system 504 is disclosed in co-pending U.S. patent application Ser. No. 10/863,103 filed on Jun. 8, 2004 (Attorney Docket No. NVDA/P001189). In one embodiment, cooling system 504 further includes, without limitation, a passive heat transport device 510 and a heat exchanger 512 coupled to CPU 506 using mounting plate 508. In one embodiment, cooling system 504 is further adapted to interface with a system fan 514 of computing device 500. Those skilled in the art will appreciate that the precise configuration of cooling system 504 and the selection of components will depend upon the size and power of GPU 506 (for example, graphics card 400 is configured to accommodate larger GPUs than graphics cards 200 or 300).

In one embodiment, graphics cards 200, 300 and 400 are configured to accommodate a certain degree of mutual compatibility, allowing some or all of graphics cards 200, 300 and 400 to be exchanged for use within a single, standardized motherboard environment (e.g., a motherboard including interface assembly 150 of FIG. 1). For example, in one embodiment, graphics card 200 is compatible with any motherboard configured to accommodate graphics card 200, graphics card 300 or graphics card 400. Graphics card 300 is compatible with motherboards configured to accommodate a graphics card 300 or graphics card 400. Exchangeability is facilitated by locating support holes 206, 306 and 406 and mounting holes 212, 312 and 412 in approximately the same relative positions on each graphics card 200, 300 or 400. For example, in one embodiment, a motherboard interface assembly may be configured to support graphics cards configured according to FIGS. 3A–C and 4A–C. In alternative embodiments, it is contemplated that graphics cards 200, 300 and 400 could be configured as self-contained cartridges that a user simply slides into or out of a port in a computing device.

Thus, the present invention represents a significant advancement in the field of graphics systems, particularly those systems designed for use with closed platform computing devices such as laptop computers. The field changeable nature of graphics cards 200, 300 and 400 enables relatively simple upgrade of computing device graphics systems. Rather than replace an entire computing device, a user may simply replace only the graphics system of the existing computing device. Thus, the useful life of a computing device may be extended by allowing the computing device to take advantage of or adapt to graphics innovations with minimal hardware modification.

Furthermore, the present invention grants more flexibility to computing device manufacturers, since it removes the approximately nine to twelve month design cycle for on-board implementations. The present invention also enables the build-to-order, stock-to-order and field repair of any of the systems disclosed, which is a significant advancement for a global economy having needs for just-in-time manufacturing and inventory management.

Those skilled in the art will appreciate that although the present invention has been described in the context of closed platform computing devices such as laptop computers, cellular telephones and PDAs, the present invention may be adapted for use with any device that uses a processor and is not easily changed by a user, such as automotive navigation systems, entertainment systems, all-in-one personal computers, printers and the like. Furthermore, although the present invention has been described in the context of standardized, field changeable graphics cards, the present invention may be deployed in other form factors such as credit card polymer substrates with embedded chips, and postage stamp-sized, self-contained devices, among others. Moreover, though the present invention has been described in terms of graphics cards, those skilled in the art will appreciate that the invention may be adapted for use with other devices that are typically hardwired to a motherboard, such as audio chips and the like.

Although the invention has been described above with reference to specific embodiments, persons skilled in the art will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A field changeable graphics card for use in a computing device, comprising:
    a printed circuit board;
    a plurality of mechanical keep-out zones defined on the printed circuit board, the keep out zones being adapted to accommodate a plurality of on-board components;
    a card connector zone disposed along a first edge of the printed circuit board;
    one or more support holes disposed proximate to a second edge of the printed circuit board, wherein the second edge is located opposite the first edge and the support holes are sized to receive supports adapted for maintaining the graphics card in a substantially parallel, spaced apart orientation relative to a motherboard,
    wherein the field changeable graphics card resides in an independent, spaced-apart position relative to the motherboard, and
    wherein the plurality of mechanical keep-out zones comprises:
    a graphics processing unit zone located on a first face of the printed circuit board and disposed proximate to a center of the printed circuit board, the graphics processing unit zone sized to receive a graphics processing unit;
    a first memory zone disposed between the graphics processing unit zone and the second edge of the printed circuit board, the first memory zone being sized to receive up to two pieces of memory; and
    a second memory zone disposed between the graphics processing unit zone and a third edge of the printed circuit board, wherein the third edge is substantially perpendicular to the first and second edges and the second memory zone is sized to receive up to two pieces of memory.

2. The graphics card of claim 1, further comprising:
    a plurality of mounting holes formed in the printed circuit board and sized to receive a plurality of fasteners for mounting a cooling system to the graphics card, wherein the plurality of mounting holes define a substantially square-shaped region that surrounds the graphics processing unit zone.

3. The graphics card of claim 2, wherein the substantially square-shaped region defined by the plurality of mounting holes overlaps at least one of the first and second memory zones.

4. The graphics card of claim 2, wherein a keep out zone is defined surrounding the support holes.

5. The graphics card of claim 2, wherein a keep out zone is defined surrounding the mounting holes.

6. The graphics card of claim 2, wherein a keep out zone is defined in the card connector zone.

7. The graphics card of claim 2, wherein the graphics processing unit zone is sized to receive a graphics processing unit of up to 35 mm×35 mm in size.

8. The graphics card of claim 2, further comprising:
    a third memory zone disposed on a second face of the printed circuit board and located proximate to the second edge of the printed circuit board, the third memory zone being sized to receive up to two pieces of memory; and
    a fourth memory zone disposed on the second face of the printed circuit board and located proximate to the third edge of the printed circuit board, the fourth memory zone being sized to receive up to two pieces of memory.

9. The graphics card of claim 8, wherein the graphics processing unit zone is sized to receive a graphics processing unit of up to 35 mm×35 mm in size.

10. The graphics card of claim 8, wherein the graphics processing unit zone is sized to receive a graphics processing unit of up to 40 mm×40 mm in size.

11. The graphics card of claim 10, wherein a distance between the first surface of the printed circuit board and a spreader plate coupled to the first memory zone is no greater than approximately 0.66 mm.

12. The graphics card of claim 8, wherein a distance between the second surface of the printed circuit board and a spreader plate coupled to the third or fourth memory zone is no greater than approximately 0.66 mm.

13. The graphics card of claim 2, wherein a height that a surface mounted component may extend above the first face of the printed circuit board is no greater than approximately 3.5 mm.

14. The graphics card of claim 2, wherein a height that a surface mounted component may extend above a second face of the printed circuit board is no greater than approximately 1.2 mm.

15. The graphics card of claim 2, wherein a distance between the first surface of the printed circuit board and mounting plate supported by the plurality of mounting holes is no more than approximately 1.85 mm.

16. The graphics card of claim 2, wherein a distance between the first surface of the printed circuit board and a spreader plate coupled to the first memory zone is no greater than approximately 2.00 mm.

17. The graphics card of claim 2, wherein a distance between the first surface of the printed circuit board and a spreader plate coupled to the second memory zone is no greater than approximately 0.66 mm.

18. The graphics card of claim 2, wherein a height that a fastener may extend above the fastener holes is no greater than 3.5 mm.

19. The graphics card of claim 2, wherein a height that a cooling system component may extend above the first face of the printed circuit board is no greater than 2.64 mm.

20. A laptop computing device comprising
a motherboard adapted for receiving a central processing unit; and
a field changeable graphics card interfaced to the motherboard and residing in an independent, spaced-apart relation relative to the motherboard, the field changeable graphics card comprising:
a printed circuit board;
a plurality of mechanical keep-out zones defined on the printed circuit board, the keep out zones being adapted to accommodate a plurality of on-board components;
a card connector zone disposed along a first edge of the printed circuit board; and
one or more support holes disposed proximate to a second edge of the printed circuit board, wherein the second edge is located opposite the first edge and the support holes are sized to receive supports adapted for maintaining the graphics card in a substantially parallel, spaced apart orientation relative to a motherboard,
wherein the plurality of mechanical keep-out zones comprises;
a graphics processing unit zone located on a first face of the printed circuit board and disposed proximate to a center of the printed circuit board, the graphics processing unit zone sized to receive a graphics processing unit;
a first memory zone disposed between the graphics processing unit zone and the second edge of the printed circuit board, the first memory zone being sized to receive up to two pieces of memory; and
a second memory zone disposed between the graphics processing unit zone and a third edge of the printed circuit board, wherein the third edge is substantially perpendicular to the first and second edges and the second memory zone is sized to receive up to two pieces of memory.

21. The laptop computing device of claim 20, further comprising:

a plurality of mounting holes Conned in the printed circuit board and sized to receive a plurality of fasteners for mounting a cooling system to the graphics card, wherein the plurality of mounting holes define a substantially square-shaped region that surrounds the graphics processing unit zone.

22. The laptop computing device of claim 21, wherein the substantially square-shaped region defined by the plurality of mounting holes overlaps at least one of the first and second memory zones.

23. The laptop computing device of claim 21, wherein a keep out zone is defined in the card connector zone.

24. The laptop computing device of claim 21, wherein a keep out zone is defined surrounding the mounting holes.

25. The laptop computing device of claim 21, wherein a keep out zone is defined in the card connector zone.

26. The laptop computing device of claim 21, wherein the graphics processing unit zone is sized to receive a graphics processing unit of up to 35 mm×35 mm in size.

27. The laptop computing device of claim 21, further comprising:
a third memory zone disposed on a second face of the printed circuit board and located proximate to the second edge of the printed circuit board, the third memory zone being sized to receive up to two pieces of memory; and
a fourth memory zone disposed on the second face of the printed circuit board and located proximate to the third edge of the printed circuit board, the fourth memory zone being sized to receive up to two pieces of memory.

28. The laptop computing device of claim 27, wherein the graphics processing unit zone is sized to receive a graphics processing unit of up to 35 mm×35 mm in size.

29. The laptop computing device of claim 27, wherein the graphics processing unit zone is sized to receive a graphics processing unit of up to 40 mm×40 mm in size.

* * * * *

UNITED STATES PATENT AND TRADEMARK OFFICE
CERTIFICATE OF CORRECTION

PATENT NO. : 7,170,757 B2  Page 1 of 1
APPLICATION NO. : 10/822014
DATED : January 30, 2007
INVENTOR(S) : Driscoll et al.

It is certified that error appears in the above-identified patent and that said Letters Patent is hereby corrected as shown below:

In column 10, line 17, replace "35 mm×35 mm" with --35 mm × 35 mm--

In column 10, line 30, replace "35 mm×35 mm" with --35 mm × 35 mm --

In column 10, line 33, replace "40 mm×40 mm" with --40 mm × 40 mm --

In column 11, line 23, replace ";" with --:--

In column 12, line 1, replace "Conned" with --formed--

In column 12, line 19, replace "35 mm×35 mm" with --35 mm × 35 mm --

In column 12, line 33, replace "35 mm×35 mm" with --35 mm × 35 mm --

In column 12, line 36, replace "40 mm×40 mm" with --40 mm × 40 mm --

Signed and Sealed this

Fifteenth Day of May, 2007

JON W. DUDAS
*Director of the United States Patent and Trademark Office*